United States Patent
Nainar

(10) Patent No.: US 7,573,331 B2
(45) Date of Patent: Aug. 11, 2009

(54) LOW POWER LOW NOISE AMPLIFIER FOR A MAGNETORESISTIVE SENSOR

(75) Inventor: Elangovan Nainar, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 826 days.

(21) Appl. No.: 11/244,821

(22) Filed: Oct. 6, 2005

(65) Prior Publication Data

US 2006/0077584 A1    Apr. 13, 2006

Related U.S. Application Data

(60) Provisional application No. 60/616,863, filed on Oct. 6, 2004.

(51) Int. Cl.
*H03F 3/45* (2006.01)
(52) U.S. Cl. .......................... 330/253; 360/46
(58) Field of Classification Search .............. 330/253; 360/46, 67, 68
See application file for complete search history.

(56) References Cited

U.S. PATENT DOCUMENTS

| | | | |
|---|---|---|---|
| 6,114,905 | A | 9/2000 | Hashimoto et al. |
| 6,163,218 | A | 12/2000 | Hashimoto et al. |
| 6,218,903 | B1 | 4/2001 | Hashimoto et al. |
| 6,622,252 | B1 | 9/2003 | Klaassen et al. |
| 6,788,142 | B2 * | 9/2004 | Li et al. ........................ 330/253 |
| 7,113,359 | B2 * | 9/2006 | Hashizume et al. ........... 360/68 |

OTHER PUBLICATIONS

Zheng, et al; "A 0.55nV/ Hz Gigabit Fully-Differential CMOS Preamplifer for MR/GMR Read Application"; ISSCC 2002, Session 3, Digital Signal Processors & Circuits.

Zheng, et al; "A 0.55nV/ Hz Gigabit Fully-Differential CMOS Preamplifer for MR/GMR Read Application"; ISSCC 2002 Visuals Supplement.

* cited by examiner

*Primary Examiner*—Steven J Mottola

(57) ABSTRACT

An amplifier for amplifying a differential input signal. The amplifier comprises a parallel configuration of a first and a second transistor differential amplifier, each responsive to a different DC bias current, wherein a gain of the amplifier is based on a sum of the transconductance of each of the first and the second differential amplifiers.

33 Claims, 5 Drawing Sheets

LOW POWER LOW NOISE AMPLIFIER FOR A MAGNETORESISTIVE SENSOR

This application claims the benefit of U.S. Provisional Patent Application No. 60/616,863 filed on Oct. 6, 2004.

FIELD OF THE INVENTION

The present invention relates generally to a hard disk drive data storage system and more particularly to an amplifier stage of a hard disk drive preamplifier operative with the hard disk drive storage system.

BACKGROUND OF THE INVENTION

Disk drives are a cost effective data storage system for use with a computer, music player or other data processing devices. As shown in FIG. 1, a disk drive 10 comprises a magnetic recording medium, in the form of a disk or platter 12 having a hub 13 and a magnetic read/write transducer 14, commonly referred to as a read/write head. The read/write head 14 is attached to or formed integrally with a suspension arm 15 suspended over the disk 12 and affixed to a rotary actuator arm 16. A structural arm 18, fixed to a platform 20 of the disk drive 10, is pivotably connected to the actuator arm 16 at a pivot joint 22. A voice coil motor 24 drives the actuator arm 16 to position the head 14 over a selected position on the disk 12.

As a spindle motor (not shown) rotates the disk 12 at an operating speed while the moving air generated by the rotating disk, in conjunction with the physical features of the suspension arm 15, lifts the read/write head 14 away from the platter 12. The head 14 glides or flies on a cushion of air slightly above an upper surface of the disk 12. The flying height of the read/write head over the disk surface is typically less than a micron.

An arm electronics module 30 may include circuits that switch the head function between read and write operations, a write driver for supplying write current to the head 14 during write operations and an amplifier for amplifying the read signal. Flexible conductive lead 32 connect the arm electronics module 30 to the head 14.

The configuration and components of the electronics module 30 may vary according to the disk drive design as will be understood by persons familiar with such technology. Although the module 30 may be mounted anywhere in the disk drive 10, a location proximate the head 14 minimizes signal losses and induced noise in the head signals during a read operation. A preferred mounting location for the module 30 comprises a side surface of the structural arm 18 as shown in FIG. 1.

As shown in a partial cross-sectional and partial block diagram of FIG. 2, the disk 12 comprises a substrate 50 and a thin film 52 disposed thereover. The head 14 comprises a write head 14A and a read head 14B.

Data bits to be written to the disk 12 are supplied by a data processing device 60 (e.g. a computer or music player) to a data write circuit 62 where the data bits are formatted and error detection/correction information appended thereto.

To write data bits to the disk 12, the voice coil motor 18 moves the suspension arm 16 to a desired radial position above the surface of the disk 12 while the spindle motor rotates the disk 12 to move a circumferential region to be written under the write head 14A. A write driver 66A, responsive to the data write circuit 62, scales up the relatively low voltages representing the data bits to a voltage range between about +/−6V and +/−10V and supplies a write current (between about 10 mA and 70 mA) to the write head 14A. The write driver 66A also shapes the write current signal waveform to optimize the data writing process. The write driver 66A is conventionally an element of a preamplifier 66, and in one embodiment the preamplifier 66 comprises an element of the electronics module 30.

Write current supplied by the write driver 66A to the write head 14A (magnetically coupled to a magnetically permeable core not shown) creates a magnetic field that extends from the core across an air gap between the write head 14A and the disk 12. The magnetic field alters a circumferential region of ferromagnetic domains in the thin film 52 to store the data bits as magnetic transitions.

The direction of the magnetic field generated by the write head 14A, and thus the direction of the altered ferromagnetic domains, is responsive to the direction of current flow through the write head 14A. Write current supplied in a first direction through the write head 14A causes the domains to align in a first direction (representing a date 0 for example) and write current supplied in a second direction (representing a data 1 for example) causes the domains to align in a second direction.

In the read mode, transitions between adjacent domains are detected to determine the stored data bit. A read head 14B (comprising either a magneto-resistive (MR) sensor or an inductive sensor) senses the magnetic transitions in the thin film 52 to detect the stored data bits. An MR sensor produces a higher magnitude output signal in response to the magnetic transitions than an inductive sensor and thus the MR sensor output signal exhibits a greater signal-to-noise ratio. The MR sensor is thus preferred, especially when a higher a real data storage density is desired. State-of-the-art MR read heads include giant magnetoresistive (GMR) heads and tunneling magnetoresistive (TMR) heads.

To read data bits from the disk 12, the suspension arm 16 moves the head 14 while the disk 12 rotates to position the read head 14B above a magnetized region to be read. A read circuit 66B of the preamplifier 66 supplies a DC (direct current) bias voltage of between about 0.025V and about 0.3V to the read head 14B. Magnetic domains in the thin film 52 passing under the read head 14B alter a resistance of the magneto-resistive material, imposing a differential AC (alternating current) component on the DC bias voltage. The AC component representing the read data bits has a relatively small magnitude (e.g., a millivolt) with respect to the DC bias voltage.

The differential signal from the read head 14B is amplified in the read circuit 66B. To reduce noise effects in subsequent signal processing stages, it is desired to maximize the amplification (gain) of the read circuit 66B consistent with signal linearity requirements and available power. The amplified signal is input to a signal processing stage 102 followed by an output or converter stage 104. Typically, both the signal processing stage 102 and the output stage 104, which provide additional signal amplification, are elements of the preamplifier 66. The output stage 104 scales up the amplified differential signal, i.e., increases a difference between the two differential signals, to a peak voltage value in a range of several hundred millivolts and supplies the scaled-up signal to circuits of a channel chip 106 through an interconnect 108. The channel chip 106 applies error detection and correction processes to the input signal and detects the read data bits from the voltage pulses. The read data bits are returned to the processing device 60 via a user interface 110 (e.g., SATA, SCSI, SAS, PCMCIA interfaces).

The amplifier within the read circuit 66B amplifies the relatively low voltage head differential output data signal (approximately 1 mVp-p) to a signal having a magnitude of about 200 mVp-p. The amplifier input referred noise is about 1 nV/sqrt (Hz) (i.e., the noise spectral density). At this noise level, a signal-to-noise ratio of the signal supplied by the amplifier to subsequent components in the read data path is sufficiently high so that the channel chip 106 operates at a sufficiently low bit error rate.

To reduce the input referred noise, the signal gain of the amplifier must be as high as possible to minimize noise effects on other components in the read signal path. Increasing the signal gain (gm) requires increasing the current supplied to the amplifier, in turn increasing the power dissipation of the disk drive storage system.

Desktop computers typically derive their operating power from an AC power source, such as a power grid, and can therefore supply continuously high current levels up to the current capacity of a power supply of the computer. Although it is advantageous to limit the current drawn or power dissipated by a desktop computer to limit heat build-up within the computer, generally the current supplied to the computer components is not constrained by the ability of the power source to supply the demanded current. However, new generations of disk drive storage systems operative with a desktop computing system limit power dissipation within the disk drive. Read signal amplifiers of the prior art may not satisfy these power dissipation limits.

In contrast to a desktop computer, minimizing power dissipation is a crucial design objective for mobile and portable computing devices and data processing systems, for stored music players and for other battery-powered devices that include a mass data storage system operative with a preamplifier. Early designs of mobile computing devices minimized power dissipation by trading power consumption for operating speed. The operating speed was limited to reduce current consumption and thus extend battery life. Given the continuing demand for higher operating speeds and data rates, such a trade-off is now less desirable.

It is known that to increase storage capacity or storage density of the disk 12, the write head 14A can record the data bits by magnetizing ferromagnetic domains vertically on the disk 12, in lieu of the circumferential recording described above. This recording technique is referred to as perpendicular recording. To retrieve the data bits, perpendicular recording requires a wider bandpass for the amplifier within the read circuit 66B and the other elements of the read channel. Preferably, the bandwidth includes frequencies as low as about 100 kHz and a low noise spectral density.

Although described above in conjunction with a hard disk drive data storage system, the head 14 and the other elements of the read data path can also operate with different types of storage media (not shown in the Figures) comprising, for example, a rigid magnetic disk, a flexible magnetic disk, magnetic tape and a magneto-optical disk.

BRIEF SUMMARY OF THE INVENTION

According to one embodiment, the present invention comprises an amplifier for amplifying differential input signals comprising a first and a second input signal. The amplifier comprises a first and a second PMOSFET each having a gate responsive to the first input signal, a first and a second NMOSFET each having a gate responsive to the second input signal, at a first node, a first source/drain of the first PMOSFET connected to a first source/drain of the first NMOSFET, at a second node, a first source/drain of the second PMOSFET connected to a first source/drain of the second NMOSFET, a first current source supplying a first DC bias current at a second source/drain of each of the first and the second PMOSFETS and a second current source supplying a second DC bias current at a second source/drain of each of the first and the second NMOSFETS, wherein the first DC bias current is different from the second DC bias current.

According to another embodiment, the present invention comprises a method for amplifying differential input signals comprising a first and a second input signal. The method comprises supplying a first DC bias current, supplying a second DC bias current wherein the first DC bias current is different from the second DC bias current, amplifying the first input signal to produce a first output signal, amplifying the second input signal to produce a second output signal, producing a first load current having an AC component responsive to the first output signal and a DC component responsive to the first and the second DC bias currents and producing a second load current having an AC component responsive to the second output signal and a DC component responsive to the first and the second DC bias currents.

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described device features are not drawn to scale, but are drawn to emphasize specific features relevant to the invention. Like reference characters denote like elements throughout the figures and text.

DETAILED DESCRIPTION OF THE INVENTION

Before describing in detail the particular method and apparatus related to an amplifier operative with a magnetic recording media, such as a disk drive system, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive. Use of the present invention is not limited to an input stage of a preamplifier for a disk drive storage system and can be used in applications other than those described herein.

Figure 1:
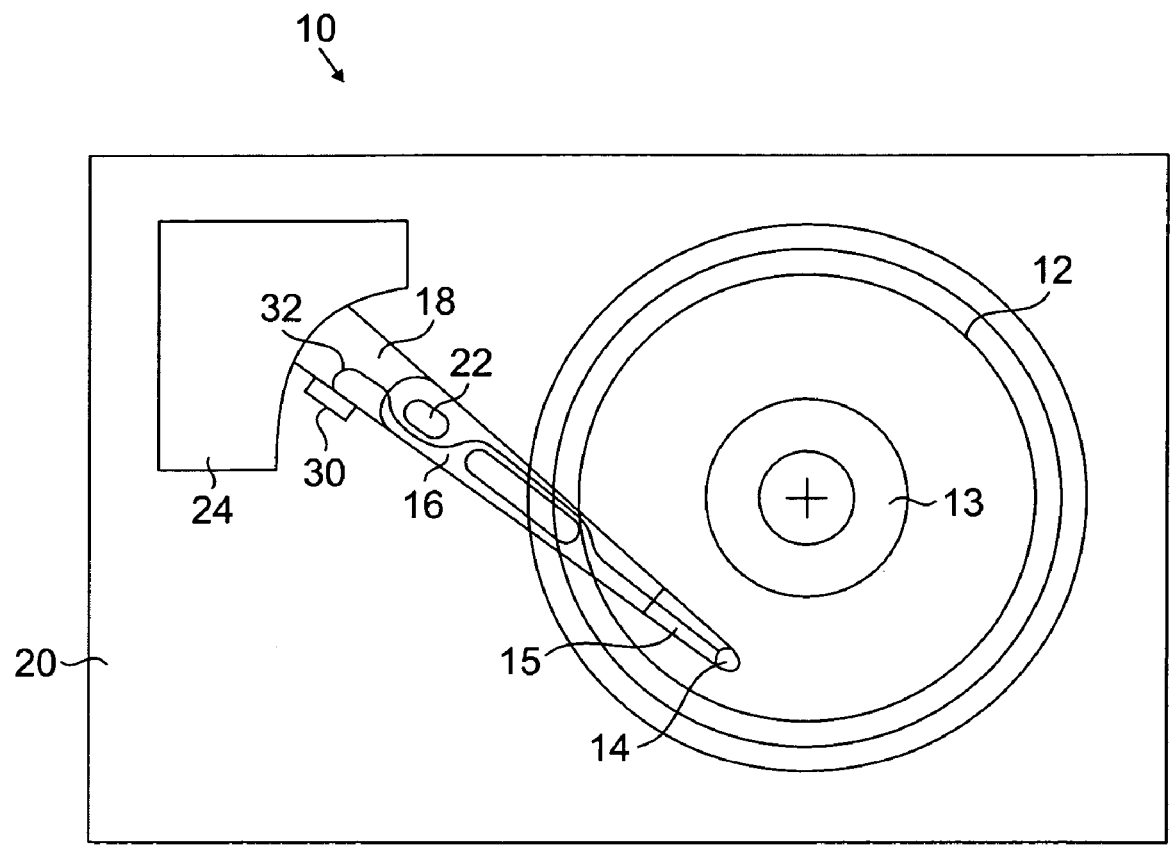
FIG. 1 illustrates a prior art disk drive to which the teachings of the present invention can be applied.
Figure 2:
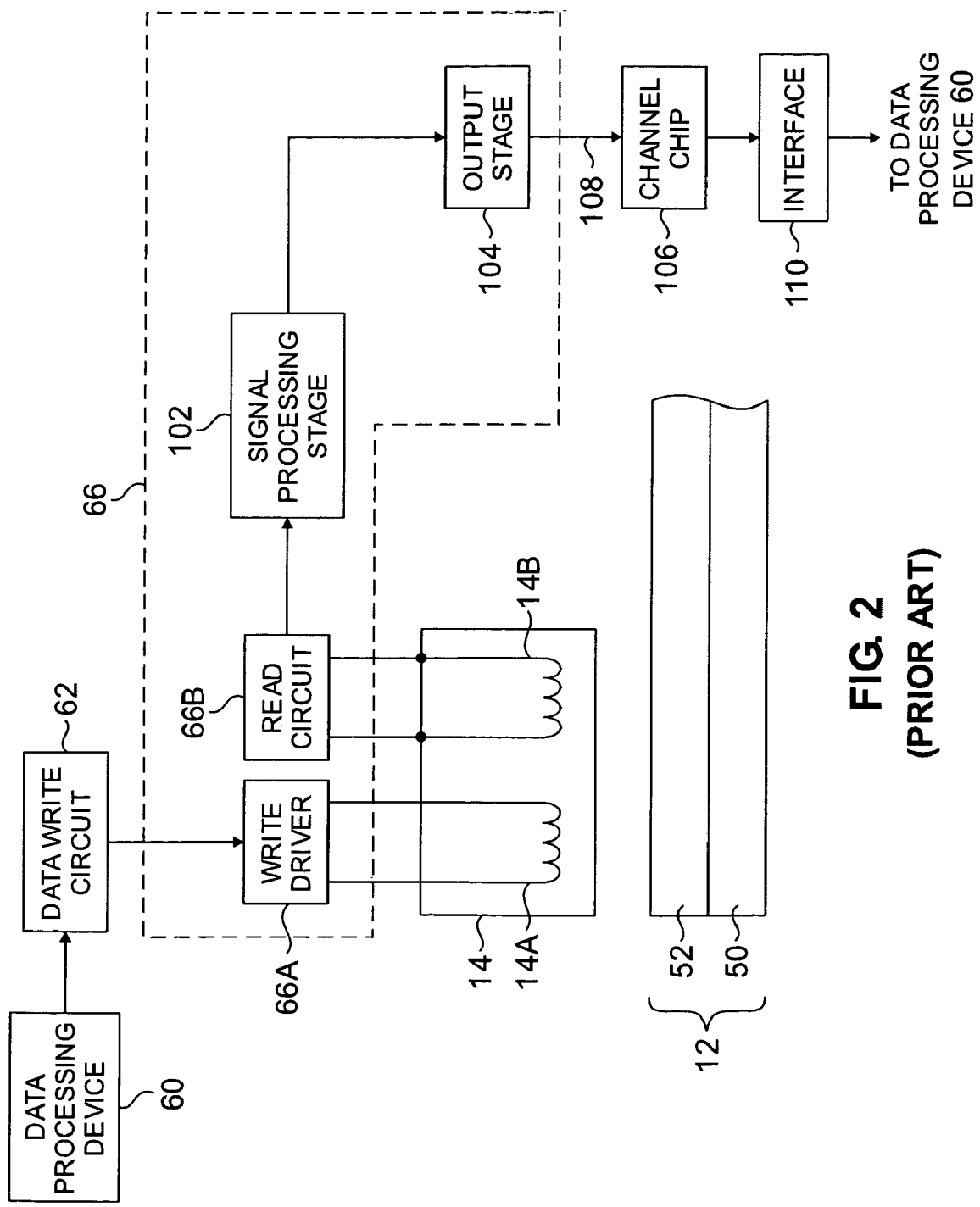
FIG. 2 is a partial cross-sectional view and partial schematic diagram of a prior art head and related components of the disk drive of FIG. 1.
Figure 3:
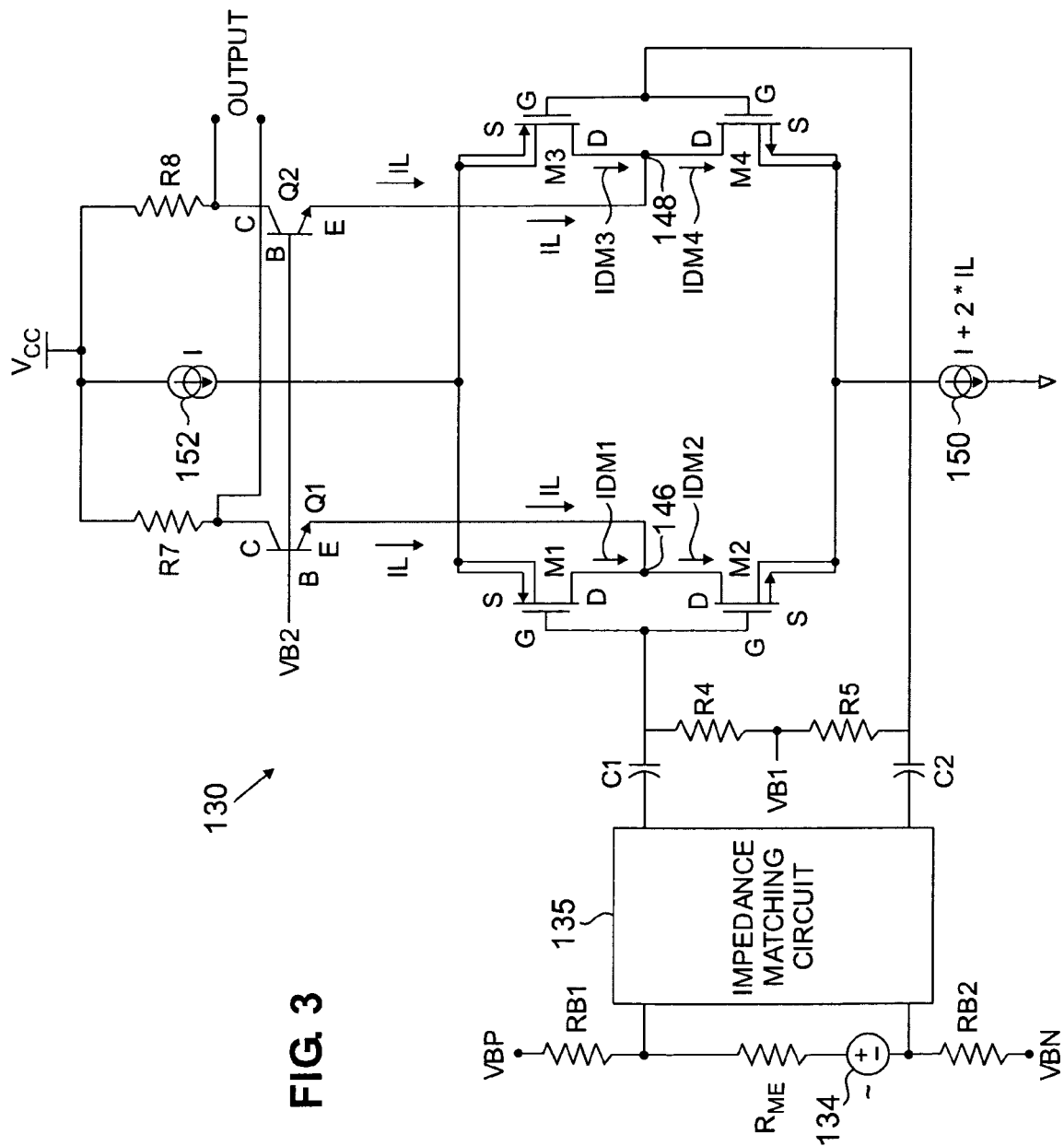
FIG. 3 is a schematic diagram of an amplifier of the present invention.

FIG. 3 illustrates a schematic of an amplifier 130 for amplify a differential data read signal produced by the read head 14B, where a resistor Rmr represents the resistance of the read head 14B. In response to magnetic domain transitions in the ferromagnetic material of the thin film 52 (See FIG. 2), the read head 14B produces an AC signal imposed on a DC bias signal. An AC voltage source 134 represents the AC read signal produced by the read head 14B. The DC head bias is supplied from two DC voltage sources VBP and VBN connected to the read head-representing resistor Rmr through resistors RB1 and RB2 respectively.

An impedance matching circuit 135, connected between the read head 14B and components associated with the amplifier, matches a head output impedance to an amplifier input impedance. The impedance matching element 131 attenuates the read signal, supplying an AC signal of about 1 mVp-p to the amplifier 130. Higher magnitude signals can be accommodated without introducing amplifier distortion.

The amplifier 130 amplifies the read head AC signal while dissipating about the same or less power than dissipated by prior art signal amplifiers operative to amplify the read signal of disk drive storage systems. In one embodiment, the amplifier 130 dissipates about 250 mW; one known prior art amplifier dissipates about 600 mW.

Capacitors C1 and C2 couple the AC differential signal from the impedance matching circuit 135 to respective connected gates G of a PMOSFET M1 and an NMOSFET M2 and to connected gates G of a PMOSFET M3 and a NMOSFET M4. Since the amplifier AC input signal is typically about 1 mVp-p, a difference between the differential signals applied to the gates G of PMOSFET M1/NMOSFET M2 and to the gates G of PMOSFET M3/NMOSFET M4 is about 1 mVp-p. The capacitors C1 and C2 block the read head DC bias from entering the amplifier 130.

With respect to the applied AC signal, the PMOSFETS M1 and M3 operate as a first differential pair in parallel with a second differential pair comprising the NMOSFETS M2 and M4. The amplified (output) AC differential read head signal is present at the commonly connected drains D of the MOSFETS M1 and M2 and at the commonly connected drains D of the MOSFETS M3 and M4.

A DC voltage bias source VB1 applies a DC bias to the gates G of the MOSFETS M1, M2, M3 and M4 through resistors R4 and R5.

A load resistor R7 (having a value of 1 kΩ in one embodiment) is connected between a voltage power supply Vcc and a collector C of a bipolar junction transistor Q1. An emitter E of the transistor Q1 is connected to a node 146 further connected to a drain D of the PMOSFET M1 and to a drain D of the NMOSFET M2.

A load resistor R8 (having a value of 1 kΩ in one embodiment) is connected between the voltage power supply Vcc and a collector C of a bipolar junction transistor Q2. An emitter E of the transistor Q2 is connected to a node 148 further connected to a drain D of the PMOSFET M3 and to a drain D of the NMOSFET M4. The differential output of the amplifier 130 is supplied to the next stage in the read data path, typically a differential amplifier, from the collector of each of the transistors Q1 and Q2.

A current source 150 supplies bias current (also referred to as tail current) I+2IL to the NMOSFETS M2 and M4. A current source 152 supplies bias current I to the PMOSFETS M1 and M3. In one embodiment the current IL is about 1 mA and the current I is about 10-12 mA.

The tail current I+2*IL of the differential pair comprising the NMOSFETS M2 and M4, supplied by the current source 150, is greater than the tail current I of the differential pair comprising the PMOSFETS M1 and M3, supplied by the current source 152. Configuring the PMOSFETS and NMOSFETS of the amplifier 130 as shown, allows DC bias current through the PMOSFETS M1 and M3 to also flow through the respective NMOSFETS M2 and M4. Since the currents entering the node 146 (and 148) must equal the currents leaving the node 146 (148), the difference in the two tail currents (IL) flows through each of the load resistors R7 and R8. The current IL through the two parallel load resistors R7 and R8 equals the NMOSFET current (I+2*IL) less the PMOSFET current (I).

Figure 4A:
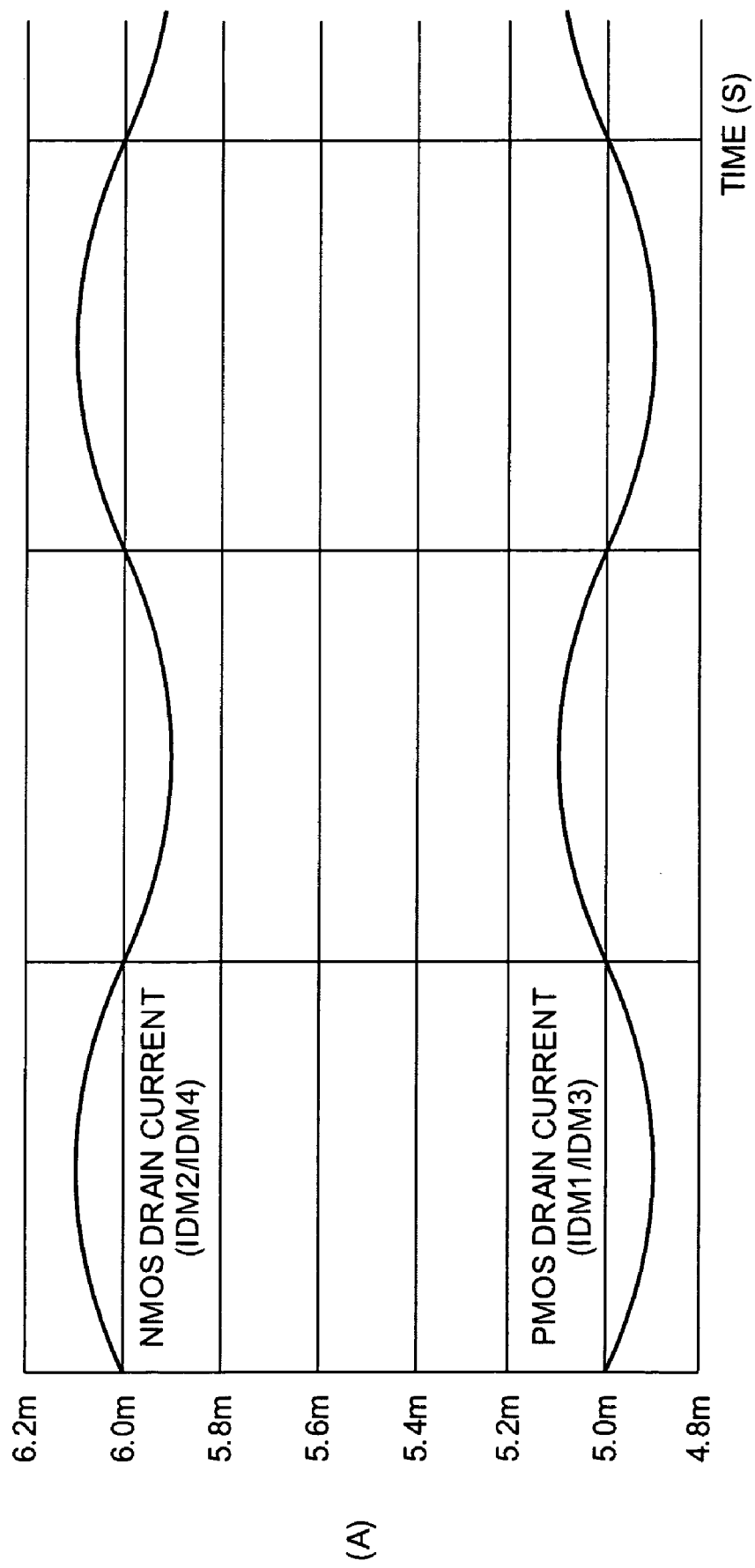
FIGS. 4A and 4B depict operational waveforms for the amplifier of the present invention.
Figure 4B:
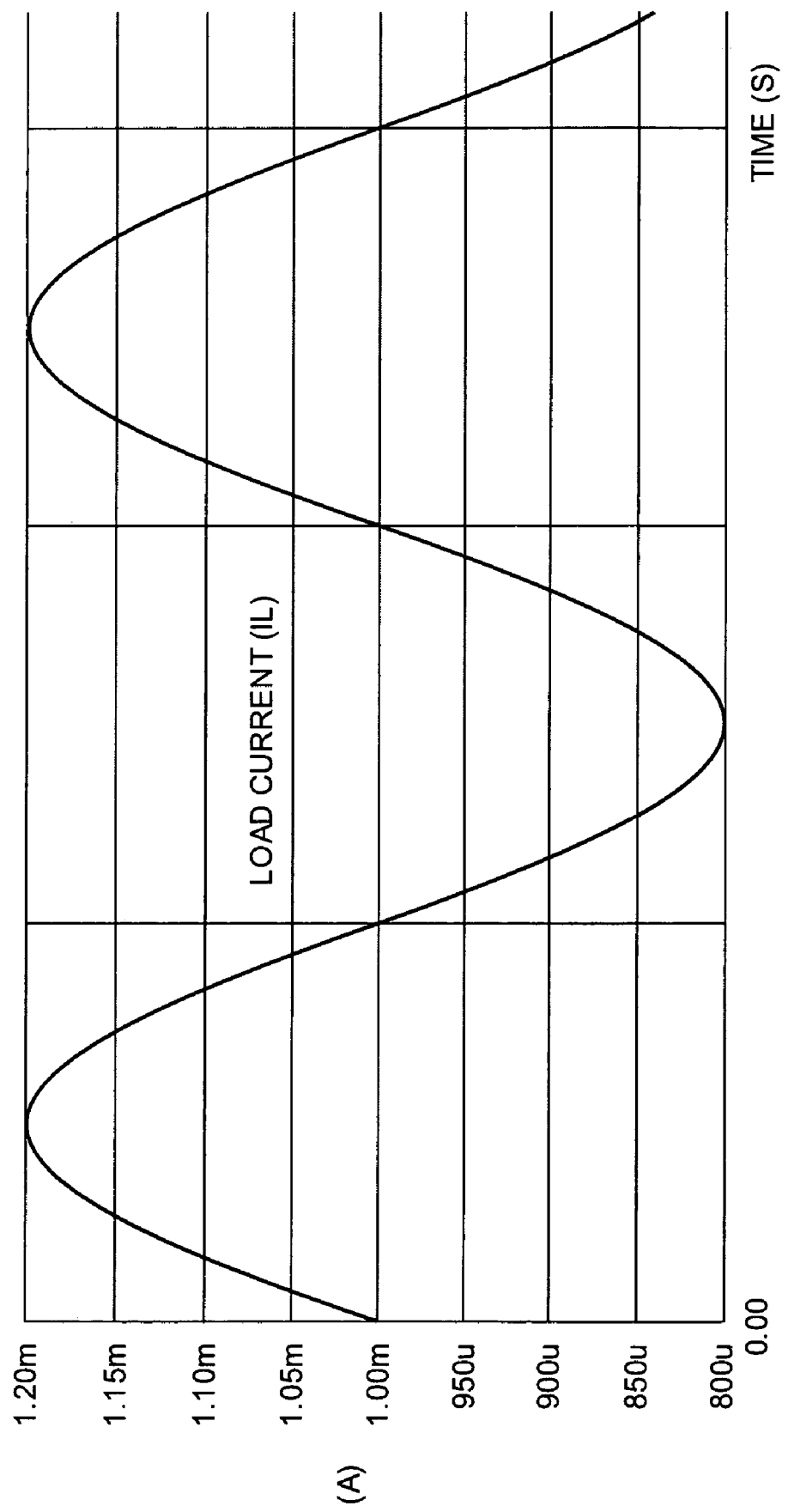

In response to the DC bias currents (assuming I=10 mA and IL=1 mA) and the input signal differential magnitude of about 1 mVp-p, both the PMOSFETS M1 and M3 and the NMOSFETS M2 and M4 are "on." As illustrated in FIG. 4A, a drain current of each one of the NMOSFETS M2 and M4 (designated IDM2 and IDM4 in FIG. 3) comprises a DC current of about 6 mA with an AC current of about 100 μA riding on the DC current. For a drain current of about 6 mA though each of the NMOSFETS, ½(I+2*IL)=6 mA.

A drain current of each one of the PMOSFETS M1 and M3 (designated IDM1 and IDM3 in FIG. 3) comprises about a 5 mA DC current and about a 100 μA AC current. The drain currents IDM1 and IDM2 are 180° out of phase, and the drain currents IDM3 and IDM4 are 180° out of phase. When the NMOSFET (M2 or M4) AC current is about +100 uA, the PMOSFET (M1 or M3) AC current is about −100 uA. For a drain current of about 5 mA through each of the PMOSFETS M1 and M3, ½ (I)=5 mA.

As can be seen from the current arrowheads at the node 146, the load current IL through the resistor R7 is a difference between the NMOSFET current and PMOSFET current at the node 146, i.e., IDM2−IDM1=IL, where IL is a 1 mA DC current with a 200 μA AC current amplitude. See FIG. 4A. As can be seen from the current arrowheads at the node 147, the load current IL through the resistor R8 is a difference between the NMOSFET current and PMOSFET current at the node 147, i.e., IDM4−IDM3=IL, where IL is a 1 mA DC current and 200 μA AC current amplitude.

Since a portion of the tail currents is common to both M1/M2 and M3/M4, the effective gain of the amplifier is determined from a sum of the transconductance of the NMOSFET differential pair (M2 and M4) and the transconductance of the PMOSFET differential pair (M1 and M3). Using the same (or less tail) current than the prior art, the higher transconductance of the amplifier 130 increases the amplifier gain and decreases the input equivalent noise. In one embodiment, the transconductance of each of the PMOSFETS M1 and M3 is about 350 μS (μsiemens) and the transconductance of each of the NMOSFETS M2 and M4 is about 700 μS (μsiemens).

The transistors Q1 and Q2 operate as cascode devices with the load current IL flowing through the collector-emitter path of each transistor. A DC voltage VB2 biases a base B of each transistor Q1 and Q2, causing the transistors Q1 and Q2 to be "on" whenever the amplifier 130 is operative.

It is known that MOSFETS exhibit a parasitic capacitance between the gate and drain terminals that shunts the output node to the input node. In particular, the parasitic capacitor feeds high frequency output signals back to the input, limiting the high frequency gain and thus the bandwidth of the MOSFET. According to the Miller effect, the effective capacitance appears significantly larger than the physical value of the parasitic capacitance due to the transconductance of the MOSFET. If Cp is a value of the parasitic capacitance and RL is the load resistance, the effective parasitic capacitance Ceff is responsive to the gain at the drain node, gm * RL. Thus, $$Ceff = Cp * gm * RL$$

MOSFETS operating as amplifier input transistors are fabricated with a relatively large channel to reduce noise generated by the MOSFET. However, the larger channel increases the parasitic capacitance Cp, in turn increasing the effective capacitance and reducing the MOSFET bandwidth. For MOSFETS configured as a differential pair, such as the MOSFETS M1/M3 and M2/M4 of FIG. 3, both MOSFETS experience the Miller effect.

The cascode transistors Q1 and Q2 reduce the Miller effect capacitance by reducing the amplification at the MOSFET'S output drain. With the cascade transistors biased on by the DC bias voltage VB2, the signal gain at the drain is:

$$Ceff=Cp*gm*re,$$

where re is the input resistance of the common base amplifier comprising the transistor Q1 or Q2. For a current IL=1 mA through the transistor Q1, re is about 2.5 Ω. Since the gain across the parasitic capacitor is relatively small compared to the gain absent the cascode transistor, the effective parasitic capacitance is small and does not appreciably effect the high frequency gain of the MOSFET and thus the MOSFET bandwidth is not affected.

The amplifier 130 preferably comprises MOSFETS in lieu of bipolar junction transistors because the higher input impedance of a MOSFET offers a wider bandwidth, and especially moves the low corner frequency of the amplifier's pass band to a lower frequency. The lower corner frequency may be important when the amplifier 130 is operative with a disk drive system employing perpendicular recording of data bits, as described above.

In other embodiments, one or more of the MOSFETS and bipolar junction transistors as described herein is replaced by an opposite polarity MOSFET or bipolar junction transistor, and a MOSFET can be replaced by a bipolar junction transistor and vice versa. The associated gate drive signals and power supply voltages are modified to accommodate the doping characteristics of the opposite polarity MOSFET or bipolar junction transistor, while providing the functionality of the present invention. Further, throughout the description of the present invention, the phrase "high" signal value means a "true" or an "asserted" state. Those skilled in the art recognize that other signal values can also be associated with a "true" or an "asserted" logic state with a corresponding change in the device responsive to the logic state.

An apparatus and method have been described as useful for amplifying a read head AC signal. Specific applications and exemplary embodiments of the invention have been illustrated and discussed. These provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. An amplifier for amplifying differential input signals comprising a first and a second input signal, the amplifier comprising:

a first PMOSFET and a first NMOSFET each having a gate responsive to the first input signal;

a second PMOSFET and a second NMOSFET each having a gate responsive to the second input signal;

at a first node, a first source/drain of the first PMOSFET connected to a first source/drain of the first NMOSFET;

at a second node, a first source/drain of the second PMOSFET connected to a first source/drain of the second NMOSFET;

a first current source supplying a first DC bias current at a second source/drain of each of the first and the second PMOSFETS; and a second current source supplying a second DC bias current at a second source/drain of each of the first and the second NMOSFETS, wherein the first DC bias current is different from the second DC bias current, wherein a first load current at the first node is based on a current through the first PMOSFET and a current through the first NMOSFET, and wherein a second load current at the second node is based on a current through the second PMOSFET and a current through the second NMOSFET.

2. The amplifier of claim 1 having a gain based on a sum of a first amplification factor of the first and the second PMOSFETS and a second amplification factor of the first and the second NMOSFETS.

3. The amplifier of claim 2 wherein the first amplification factor comprises a PMOSFET transconductance, the second amplification factor comprises a NMOSFET transconductance and the gain comprises a sum of the PMOSFET transconductance and the NMOSFET transconductance.

4. The amplifier of claim 1 wherein the first load current comprises a first AC load current responsive to the first input signal and the second load current comprises a second AC load current responsive to the second input signal, and wherein both the first and the second AC load currents ride on a DC bias current responsive to the first and the second DC bias currents.

5. The amplifier of claim 4 wherein the first load current flows through a first resistor to produce a first amplifier output voltage and the second load current flows through a second resistor to produce a second amplifier output voltage.

6. The amplifier of claim 1 further comprising a first and a second load element connected between a power supply and the first and the second nodes, respectively.

7. The amplifier of claim 6 wherein each of the first and the second load elements comprises a first and a second resistor, respectively.

8. The amplifier of claim 6 wherein a first load current through the first load element is determined such that a sum of currents entering and leaving the first node is substantially zero and a second load current through the second load element is determined such that a sum of currents entering and leaving the second node is substantially zero.

9. The amplifier of claim 1 wherein the first DC current comprises a current I and the second DC current comprises a current I+2*IL, and wherein a current IL comprises a load current.

10. The amplifier of claim 9 wherein currents at the first node comprise a first load current IL, a first PMOSFET current I/2 and a first NMOSFET current ½(I+2*IL), and currents at the second node comprise a second load current IL, a second PMOSFET current I/2 and a second NMOSFET current ½(I+2*IL).

11. The amplifier of claim 1 wherein a current through the first PMOSFET is less than a current through the first NMOSFET and wherein a difference between the current through the first PMOSFET and the current through the first NMOSFET comprises a first load current.

12. The amplifier of claim 1 wherein a current through the second PMOSFET is less than a current through the second NMOSFET, and wherein a difference between the current through the second PMOSFET and the current through the second NMOSFET comprises a second load current.

13. An amplifier for amplifying differential input signals comprising a first and a second input signal, the amplifier comprising:
- a first first-polarity transistor and a first second-polarity transistor each having an input terminal responsive to the first input signal;
- a second first-polarity transistor and a second second-polarity transistor each having an input terminal responsive to the second input signal;
- at a first node, a first terminal of the first first-polarity transistor connected to a first terminal of the first second-polarity transistor;
- at a second node, a first terminal of the second first-polarity transistor connected to a first terminal of the second second-polarity transistor;
- a first current source supplying a first DC bias current at a second terminal of the first and the second first-polarity transistors; and
- a second current source supplying a second DC bias current at a second terminal of the first and the second second-polarity transistors, wherein the first bias current is different from the second bias current,
- wherein a first load current at the first node comprises a difference between a current through the first first-polarity transistor and a current through the first second-polarity transistor, and wherein a second load current at the second node comprises a difference between a current through the second first-polarity transistor and a current through the second second-polarity transistor.

14. The amplifier of claim 13 having a gain based on a sum of a first amplification factor of the first and the second first-polarity transistors and a second amplification factor of the first and the second second-polarity transistors.

15. The amplifier of claim 14 wherein the first amplification factor comprises a first transconductance of the first-polarity transistors, the second amplification factor comprises a second transconductance of the second-polarity transistors and the gain comprises a second transconductance of the second-polarity transistors and the gain comprises a sum of the first and the second transconductance.

16. The amplifier of claim 13 wherein the first load current comprises a first AC load current responsive to the first input signal and the second load current comprises a second AC load current responsive to the second input signal, and wherein both the first and the second AC load currents ride on a DC bias current responsive to the first and the second DC bias currents.

17. The amplifier of claim 16 wherein the first load current flows through a first resistor to produce a first output voltage and the second load current flows through a second resistor to produce a second output voltage.

18. A preamplifier for receiving differential input signals, comprising a first and a second input signal, from a magnetoresistive element, the preamplifier comprising:
- a first PMOSFET and a first NMOSFET each having a gate responsive to the first input signal;
- a second PMOSFET and a second NMOSFET each having a gate responsive to the second input signal;
- at a first node, a first source/drain of the first PMOSFET connected to a first source/drain of the first NMOSFET;
- at a second node, a first source/drain of the second PMOSFET connected to a first source/drain of the second NMOSFET;
- a first current source supplying a first DC bias current to a second source/drain of the first and the second PMOSFETS;
- a second current source supplying a second DC bias current to a second source/drain of the first and the second NMOSFETS, wherein the first current is different from the second current; and
- a first and second load element connected between a power supply and the first and the second nodes, respectively.

19. The preamplifier of claim 18 having a gain based on a sum of a first amplification factor of the first and the second PMOSFETs and a second amplification factor of the first and the second NMOSFETS.

20. The preamplifier of claim 19 wherein the first amplification factor comprises a PMOSFET transconductance, the second amplification factor comprises a NMOSFET transconductance and the gain comprises a sum of the PMOSFET transconductance and the NMOSFET transconductance.

21. The preamplifier of claim 18 wherein a current through the first PMOSFET is less than a current through the first NMOSFET, and wherein a difference between the current through the first PMOSFET and the current through the first NMOSFET comprises a first load current, and wherein a current through the second PMOSFET is less than a current through the second NMOSFET, and wherein a difference between the current through the first PMOSFET and the current through the first NMOSFET comprises a second load current.

22. The preamplifier of claim 21 wherein the first load current comprises a first AC load current responsive to the first input signal and the second load current comprises a second AC load current responsive to the second input signal, and wherein both the first and the second AC load currents ride on a DC bias current responsive to the first and the second DC bias currents.

23. The preamplifier of claim 21 wherein the first load current flows through the first load element to produce a first output voltage and the second load current flows through the second load element to produce a second output voltage.

24. The preamplifier of claim 18 wherein the first DC current comprises a current I and the second DC current comprises a current I+2*IL, and wherein a current IL comprises a load current.

25. The preamplifier of claim 24 wherein currents at the first node comprise a first load current IL, a first PMOSFET current I/2 and a first NMOSFET current ½(I+2*IL), and currents at the second node comprise a second load current IL, a second PMOSFET current I/2 and a second NMOSFET current ½(I+2*IL).

26. The preamplifier of claim 18 wherein the magnetoresistive element comprises a read head of a disk drive storage system.

27. The preamplifier of claim 18 further comprising an impedance matching element disposed between the magnetoresistive element and the gate of each of the first and the second PMOSFETS and the first and the second NMOSFETS, wherein the impedance matching element produces the first and second input signals.

28. The preamplifier of claim 18 further comprising a bias element for providing a DC bias voltage to each gate of the first and the second PMOSFETS and the first and the second NMOSFETS.

29. The preamplifier of claim 18 further comprising a first bipolar junction transistor having an emitter/collector path disposed between the first load element and the first node and a second bipolar junction transistor having an emitter/collector path disposed between the second load element and the second node.

30. The preamplifier of claim 29 further comprising a bias element for biasing the first and the second bipolar junction transistors.

31. A method for amplifying differential input signals comprising a first and a second input signal, the method comprising:
   supplying a first DC bias current;
   supplying a second DC bias current wherein the first DC bias current is different from the second DC bias current;
   amplifying the first input signal to produce a first output signal;
   amplifying the second input signal to produce a second output signal;
   producing a first load current having an AC component responsive to the first output signal and a DC component responsive to the first and the second DC bias currents; and
   producing a second load current having an AC component responsive to the second output signal and a DC component responsive to the first and the second DC bias currents,
   wherein the first load current comprises a difference between a current through a first first-polarity transistor and a current through a first second-polarity transistor, and wherein the second load current comprises a difference between a current through a second first-polarity transistor and a current through a second second-polarity transistor.

32. The method of claim 31 wherein the first and the second output signals comprise a first output current that flows through a first resistor to produce a first amplifier output voltage and a second output current that flows through a second resistor to produce a second amplifier output voltage.

33. The method of claim 31 wherein the AC component of the first load current comprises the first output current and the AC component of the second load current comprises the second output current.

* * * * *